US009397197B1

(12) United States Patent
Guo et al.

(10) Patent No.: US 9,397,197 B1
(45) Date of Patent: Jul. 19, 2016

(54) FORMING WRAP-AROUND SILICIDE CONTACT ON FINFET

(71) Applicant: International Business Machines Corporation, Armonk, NY (US)

(72) Inventors: Dechao Guo, Niskayuna, NY (US); Hemanth Jagannathan, Niskayuna, NY (US); Zuoguang Liu, Schenectady, NY (US); Shogo Mochizuki, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/862,767

(22) Filed: Sep. 23, 2015

(51) Int. Cl.
*H01L 29/66* (2006.01)
*H01L 29/78* (2006.01)

(52) U.S. Cl.
CPC .... *H01L 29/66795* (2013.01); *H01L 29/66545* (2013.01); *H01L 29/7853* (2013.01); *H01L 2029/7858* (2013.01)

(58) Field of Classification Search
CPC ............... H01L 29/66545; H01L 29/66795; H01L 29/7853
USPC .......................................................... 257/412
See application file for complete search history.

(56) References Cited

U.S. PATENT DOCUMENTS

| 7,531,423 | B2 | 5/2009 | Cheng et al. |
| 7,692,254 | B2 | 4/2010 | Anderson et al. |
| 8,362,568 | B2 | 1/2013 | Lin et al. |
| 8,753,964 | B2 | 6/2014 | Bryant et al. |
| 8,766,319 | B2 | 7/2014 | Lai et al. |
| 9,006,805 | B2 | 4/2015 | Liao et al. |
| 2009/0096002 | A1 | 4/2009 | Yu et al. |
| 2011/0147840 | A1* | 6/2011 | Cea .................... H01L 29/41791 257/347 |
| 2011/0298058 | A1 | 12/2011 | Kawasaki et al. |
| 2013/0069128 | A1 | 3/2013 | Okano |
| 2013/0071980 | A1 | 3/2013 | Lin et al. |
| 2013/0134513 | A1* | 5/2013 | Standaert .............. H01L 29/785 257/347 |
| 2013/0187228 | A1* | 7/2013 | Xie ........................ H01L 29/785 257/347 |
| 2014/0027863 | A1 | 1/2014 | Adam et al. |
| 2014/0159159 | A1* | 6/2014 | Steigerwald ...... H01L 29/66795 257/369 |
| 2015/0236016 | A1* | 8/2015 | Wann .................. H01L 27/0886 257/401 |

(Continued)

OTHER PUBLICATIONS

A. Dixit et al., "Minimization of MuGFET source/drain resistance using wrap-around NiSi-HDD contacts," Solid-State Electronics, vol. 50, Jul. 17, 2006, pp. 1-6.

(Continued)

*Primary Examiner* — Christine Enad
(74) *Attorney, Agent, or Firm* — Cantor Colburn LLP; Vazken Alexanian

(57) ABSTRACT

A technique relates to a transistor. Dummy gates are formed on top of an isolation layer and over fins. Pillars are along sides of fins such that trenches separate the pillars from the sides of the fins. The pillars include a first intermediate layer formed on an isolation layer and a second intermediate layer formed on the first intermediate layer. An epitaxial layer is deposited in the trenches such that the epitaxial layer is laterally confined by the pillars. The top of the epitaxial layer forms a triangular shape that extends higher than the pillars. The pillars are removed such that straight sidewalls of the epitaxial layer are exposed. Dummy gates are replaced with replacement gates. A metal silicide contact that wraps around a source part and a drain part of the epitaxial layer is formed, by forming a conductive layer on top of the structure.

9 Claims, 18 Drawing Sheets

(56) References Cited

U.S. PATENT DOCUMENTS

2015/0303118 A1* 10/2015 Wang .............. H01L 21/823481
257/401
2016/0064528 A1* 3/2016 Lu ......................... H01L 29/785
257/288

OTHER PUBLICATIONS

N.S. Bennett, et al., "Enhanced n-type dopant solubility in tensile-strained Si," Thin Solid Films, 517, Aug. 2008, pp. 331-333.

S. Murarka, "Refractory Silicides for Integrated Circuits," J. Vac. Sci. Tecnology, 17(4), Jul./Aug. 1980, Abstract Only, pp. 1-2.

Basker et al.,"Contact Area Improvement and Stress Formation in Unmerged EPI Flow for FinFETs," U.S Appl. No. 14/505,000, filed Oct. 2, 2014.

Dechao Guo, et al.; "Forming Wrap-Around Silicide Contact on FinFET"; U.S. Appl. No. 14/952,108, filed Nov. 25, 2015.

List of IBM Patents or Patent Applications Treated as Related—Date Filed: Jan. 26, 2016; 1 page.

Yamashita et al., "Advanced Structure to Form Epi adn Slicide at Fin Top and Bottom," U.S. Appl. No. 14/824,349, filed Aug. 12, 2015.

List of IBM Patents or Patent Applications Treated as Related—Date Filed: Mar. 15, 2016; 1 page.

* cited by examiner

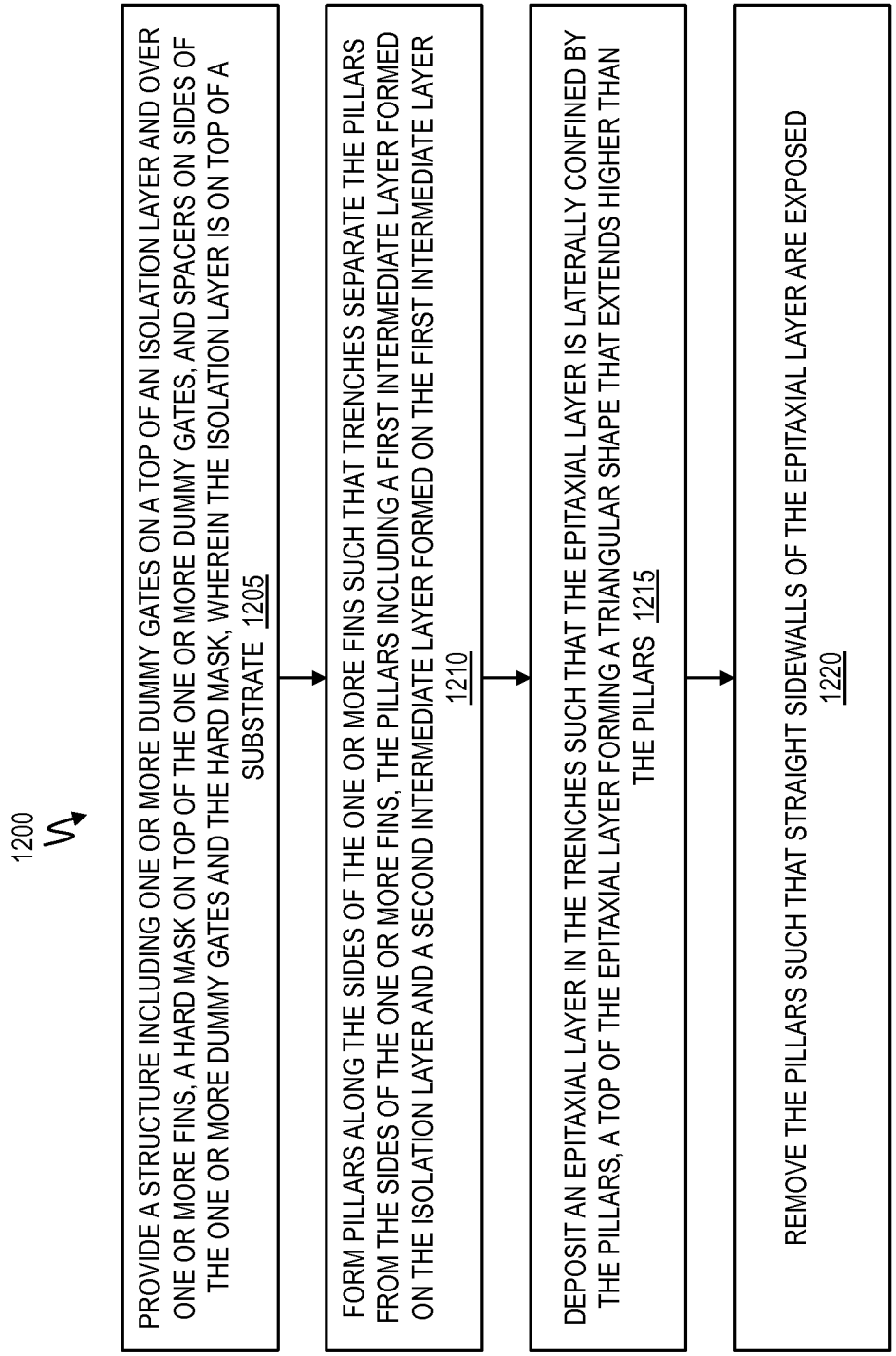

FORMING WRAP-AROUND SILICIDE CONTACT ON FINFET

BACKGROUND

The present invention relates to semiconductors, and more specifically, to forming wrap-around silicide contacts on fin-FET.

While the planar field effect transistor (FET) may appear to have reached the end of its scalable lifespan, the semiconductor industry has found an alternative approach with finFETs. FinFET technology is viewed by many as the best choice for next generation advanced processes.

With advanced geometry planar FET technologies, such as 20 nanometer (nm) fabrication, the source and the drain encroach into the channel, making it easier for leakage current to flow between them and in turn making it very difficult to turn the transistor off completely. FinFETs are three-dimensional structures that rise above the substrate and resemble a fin, hence the name. Certain techniques are utilized to form the fins for n-channel FETs and p-channel FETs.

SUMMARY

According to one embodiment, a method of forming a transistor is provided. The method includes providing a structure including one or more dummy gates on a top of an isolation layer and over one or more fins, a hard mask on top of the one or more dummy gates, and spacers on sides of the one or more dummy gates and the hard mask. The isolation layer is on top of a substrate. Pillars are formed along sides of the one or more fins such that trenches separate the pillars from the sides of the one or more fins, and the pillars includes a first intermediate layer formed on the isolation layer and a second intermediate layer formed on the first intermediate layer. An epitaxial layer is deposited in the trenches such that the epitaxial layer is laterally confined by the pillars, and a top of the epitaxial layer forms a triangular shape that extends higher than the pillars. The pillars are removed such that straight sidewalls of the epitaxial layer are exposed, and the one or more dummy gates and the hard mask are replaced with one or more replacement gates. A first filling material is formed on top of the structure, such that contact openings in the first filling material are formed over a source part of the epitaxial layer on the one or more fins, a drain part of the epitaxial layer on the one or more fins, and the one or more replacement gates. A metal silicide contact is formed that wraps around the source part of the epitaxial layer and the drain part of the epitaxial layer, by forming a conductive layer on top of the structure.

According to one embodiment, a transistor is provided. The transistor includes a structure including one or more replacement gates on a top of an isolation layer and over one or more fins, and spacers on sides of the one or more replacement gates, where the isolation layer is on top of a substrate. An epitaxial layer is formed around the one or more fins, and a top of the epitaxial layer forms a triangular shape that extends higher than the one or more fins, where the epitaxial layer has straight sidewalls. A first filling material is on top of portions of the epitaxial layer, the spacers, and the one or more replacement gates, where contact openings in the first filling material are over a source part of the epitaxial layer on the one or more fins, a drain part of the epitaxial layer on the one or more fins, and the one or more replacement gates. A conductive layer is formed on top of the filling material, over the source part of the epitaxial layer on the one or more fins, over the drain part of the epitaxial layer on the one or more fins, and over the one or more replacement gates. A metal silicide contact wraps around the source part of the epitaxial layer and the drain part of the epitaxial layer.

According to one embodiment, a method of forming a transistor is provided. The method includes providing a structure including one or more dummy gates on a top of an isolation layer and over one or more fins, a hard mask on top of the one or more dummy gates, and spacers on sides of the one or more dummy gates and the hard mask, where the isolation layer is on top of a substrate. A first intermediate layer is deposited on top of the structure, where first trenches having been covered in the first intermediate layer are on sides of the one or more fins. A second intermediate layer on top of the structure, such that the first trenches are filled, where a portion of the second intermediate layer is recessed to correspond to a height to fill the first trenches. A portion of the first intermediate layer that is not covered by the second intermediate layer is removed, such that second trenches are formed on the sides of the one or more fins, where pillars are formed of the second intermediate layer on top of the first intermediate layer not having been removed. An epitaxial layer is deposited in the second trenches such that the epitaxial layer is laterally confined by the pillars, and a top of the epitaxial layer forms a triangular shape that extends higher than the pillars. The pillars of the second intermediate layer on top of the first intermediate layer are removed, such that straight sidewalls of the epitaxial layer are exposed. The one or more dummy gates and the hard mask are replaced with one or more replacement gates. A first filling material is formed on top of the structure, such that contact openings in the first filling material are formed over a source part of the epitaxial layer on the one or more fins, a drain part of the epitaxial layer on the one or more fins, and the one or more replacement gates. A metal silicide contact that wraps around the source part of the epitaxial layer of the one or more fins and the drain part of the epitaxial layer of the one or more fins is formed, by depositing a conductive layer on top of the structure. The conductive layer wraps around the source part of the epitaxial layer and the drain part of the epitaxial layer. A second filling material is deposited on top of the first filling material. The first filling material, the second filling material, and the conductive layer are planarized such that the conductive layer is not continuous, thereby separating the conductive layer from connecting the source part, the drain part, and the one or more replacement gates.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

FIGS. 12A and 12B together illustrate a flow chart of a method of forming a transistor with wrap-around metal silicide according to an embodiment.

DETAILED DESCRIPTION

Contact resistance dominants as transistor device scaling continues beyond (i.e., below) 10 nanometer (nm) technology node. The term contact resistance is the contribution to the total resistance of a material in which total resistance comes from the electrical leads and connections, as opposed to the intrinsic resistance that is an inherent property independent of the measurement method.

Contact resistivity (RhoC) reduction alone is not enough to reduce external resistance to its target for 10 nm technology node and beyond, and a new contact structure is needed to increase contact area. Current contact resistivity (RhoC) of metal liner silicide is required to be less than (<) $5e^{-9}$ ohm*cm$^2$ for 14 nm technology node and beyond. With such a good contact resistance level of metal liner silicide, an increase in contact area would be beneficial for reducing contact resistance Rc (Rc=RhoC/area). The wrap-around contact may be considered the ideal contact structure for 3D finFETs. However, the wrap-around contact has been difficult to achieve.

Embodiments provide techniques for fabricating wrap-around metal liner silicide to increase contact area and thus reduce contact resistance. A new flow/method is provided to fabricate a wrap-around liner silicide contact on the source (S) and drain (D). It is noted that the wrap-around liner contact is silicide and not salicide. The flow/method can be manufactured using 10 nm technology and beyond. According to embodiments, a "pencil-shaped" epitaxial source/drain (S/D) is made by a novel spacer process scheme. Metal silicide is wrapped around the pencil-shaped epitaxial source/drain to increase contact area and thus reduce contact resistance Rc.

According to embodiments, an exemplary fabrication process of building a field effect transistor with one or more fins and with metal silicide wrapped around the pencil-shaped epitaxial source/drain is illustrated in FIGS. 1-11.

Figure 1:
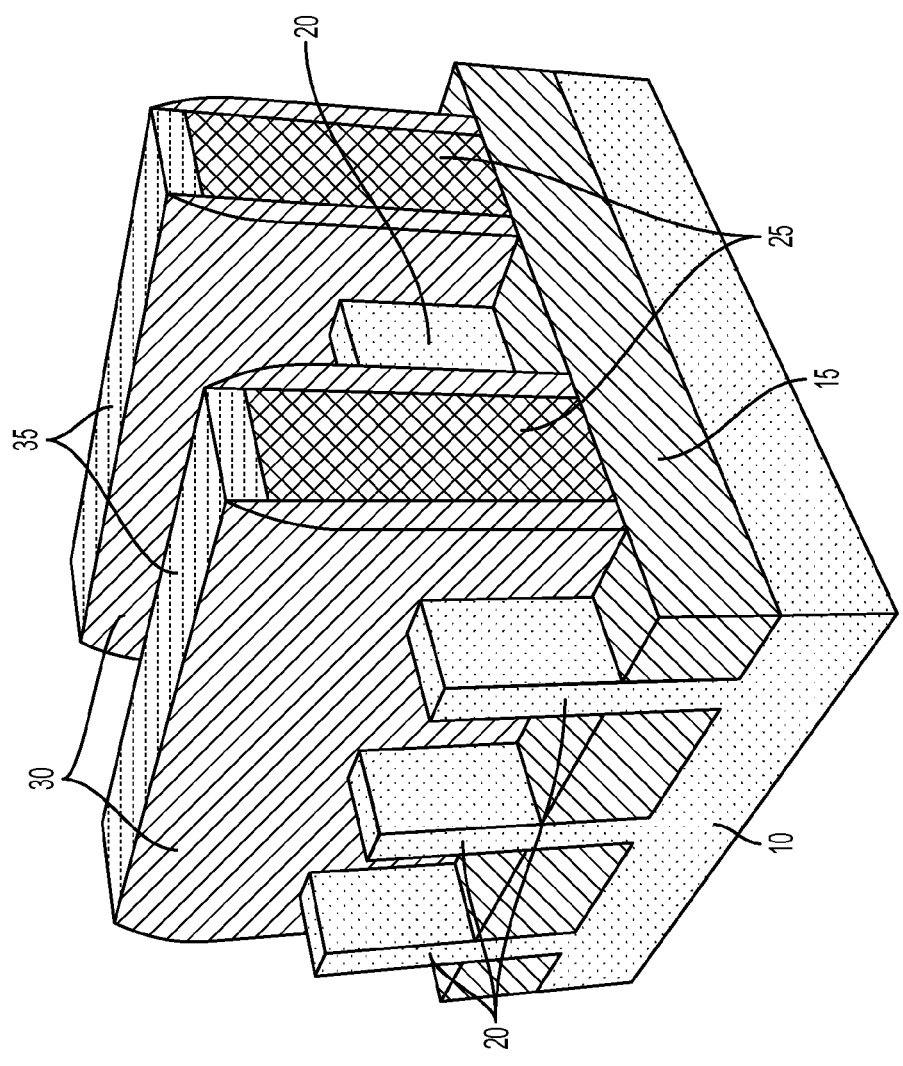
FIG. 1 is a perspective view of an intermediate fin field effect transistor (finFET) device according to an embodiment.

FIG. 1 is a perspective view of an intermediate finFET device 100 according to an embodiment. The intermediate finFET device 100 includes a semiconductor substrate 10 with fins 20 formed on the semiconductor substrate 10. The fins 20 are to form the sources and drains in the intermediate finFET device 100. In one implementation, the fins 20 may be formed by etching the semiconductor substrate 10 into a pattern that leaves the fins 20, such that the fins 20 are made of the material of the semiconductor substrate 10.

An oxide layer 15 is deposited on the semiconductor substrate 10. The oxide layer 15 provides shallow trench isolation (STI) in the intermediate finFET device 100. The oxide layer 15 may also be referred to as a box or isolation layer. In one implementation, the semiconductor substrate 10 and the fins 20 may be silicon (Si), and the oxide layer 15 may be silicon dioxide ($SiO_2$). In another implementation, the semiconductor substrate 10 and the fins 20 may be silicon germanium (SiGe).

A dummy gate 25 may be formed over the fins 20. A hard mask layer 35 may be formed on top of the dummy gate 25. A low-k spacer layer 30 is deposited on the dummy gate 25, hard mask 35, and fins 20. After a directional dry etch process (e.g., reactive ion etch (RIE)) from the top in z-direction, the low-k spacer is removed from the fins 20. But the low-k spacer layer 30 is formed on the sides of both the dummy gate 25 and the hard mask layer 35 because of the taller low-k layer (in z-direction) on the sidewalls of the dummy gate 25 than that on the fins 20. In one implementation, the dummy gate 25 may include polysilicon and/or amorphous silicon. The low-k spacer layer 30 may include silicon boron nitride (SiBN), silicon oxycarbonitride (SiOCN). The hard mask 35 may be a nitride (N) layer.

Figure 2:
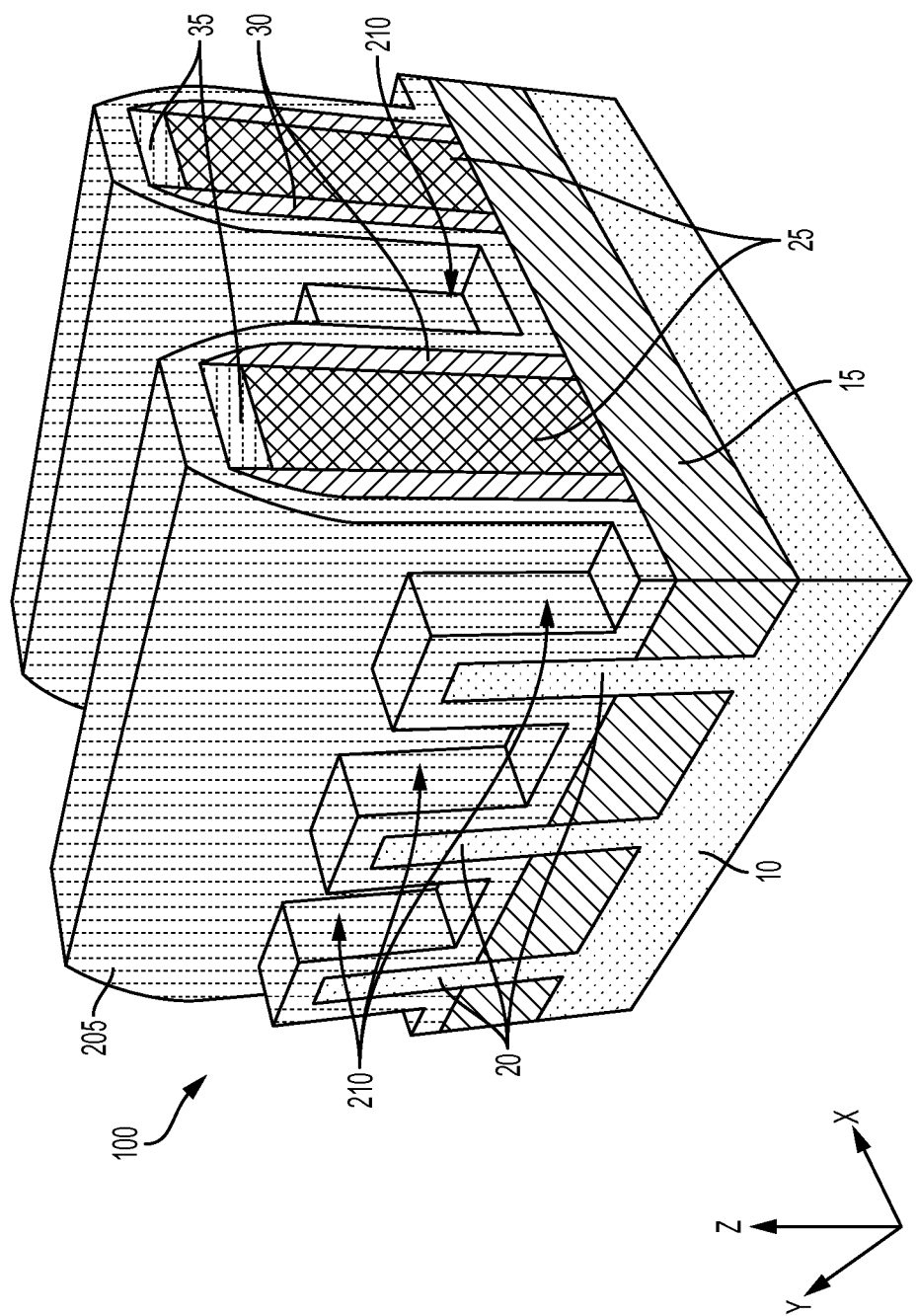
FIG. 2 is a perspective view of the intermediate finFET device illustrating deposition of an oxide layer according to an embodiment.

FIG. 2 is a perspective view of the intermediate finFET device 100 illustrating an oxide layer 205 (also referred to as the first intermediate layer) according to an embodiment. In FIG. 2, the oxide layer 205 may be conformally deposited on the top surface of the finFET device 100. Particularly, the oxide layer 205 is formed on the tops and sides of the fins 20, the top of the oxide layer 15, top and side of the low-k spacer layer 30, and the top and sides of the hard mask 35. Trenches 210 (also referred to as first trenches) are formed in the intermediate finFET device 100. The trenches 210 are on both sides of the fins 20.

The oxide layer 205 may be silicon dioxide ($SiO_2$). The oxide layer 205 may be deposited by atomic layer deposition (ALD). In one implementation, the oxide layer 205 may be approximately 8 nm thick.

Figure 3:
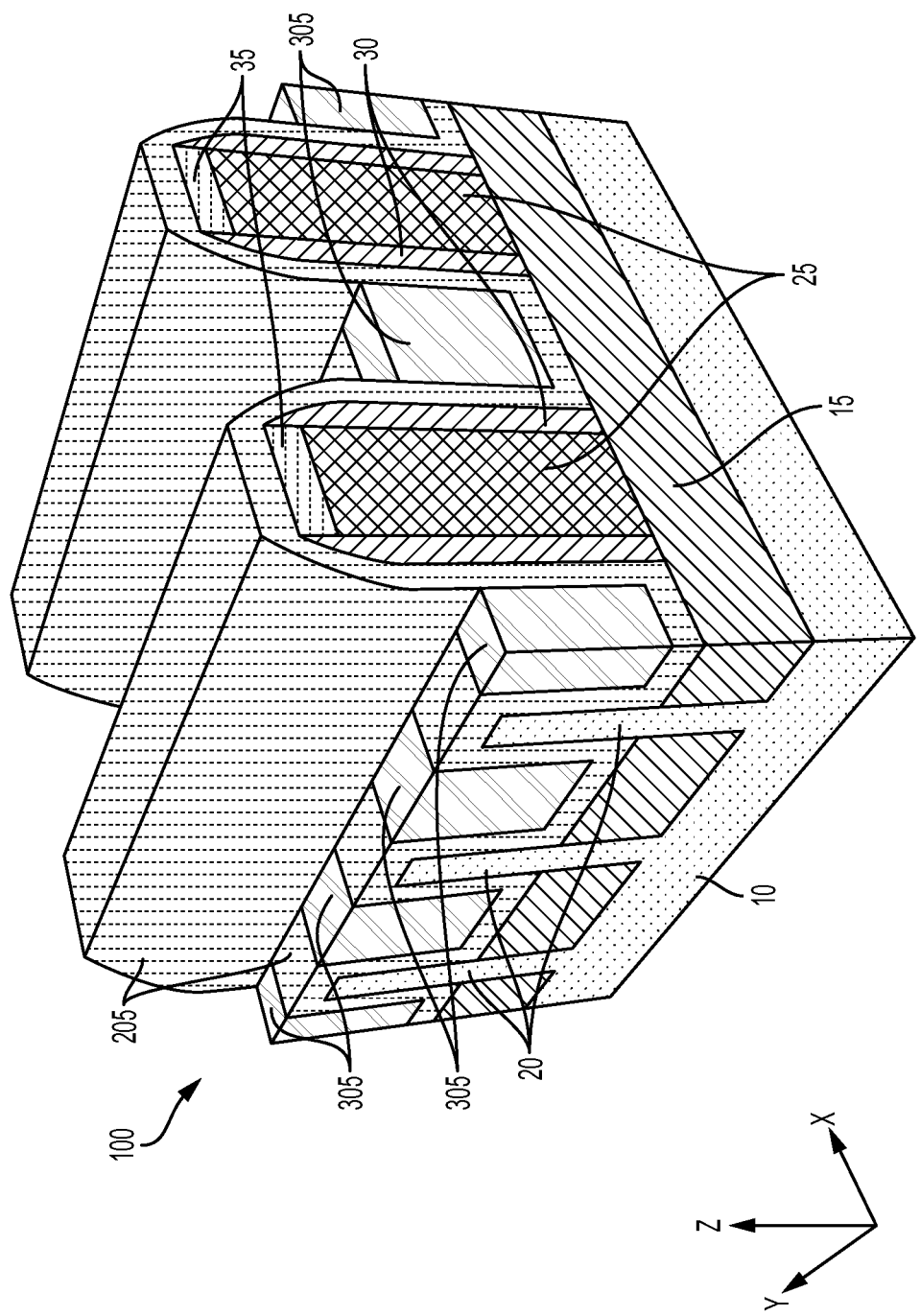
FIG. 3 is a perspective view of the intermediate finFET device illustrating deposition of a filling material according to an embodiment.

FIG. 3 illustrates deposition of a filling material 305 (e.g., the second intermediate layer) on the intermediate finFET device 100 according to an embodiment. In FIG. 3, the filling material 305 may be conformally deposited over the top surface of the intermediate finFET device 100. The filling material 305 may be recessed to correspond to the top of the oxide layer 205 over the fins 20. In other words, the filling material 305 may be etched to fill in the trenches 210. The filling material 305 may be silicon nitride (SiN). The silicon nitride of the filling material 305 has a high selectivity with respect to silicon dioxide of the oxide layer 205 when etching. Dry etching, such as reactive ion etching (RIE), may be utilized to etch the filling material 305 while not etching the silicon dioxide. The dry etching can be controlled to stop the etching of the filling material 305 at approximately the top (e.g., matching the height) of the oxide layer 205 over the fins 20, thereby filling the trenches 210.

Figure 4:
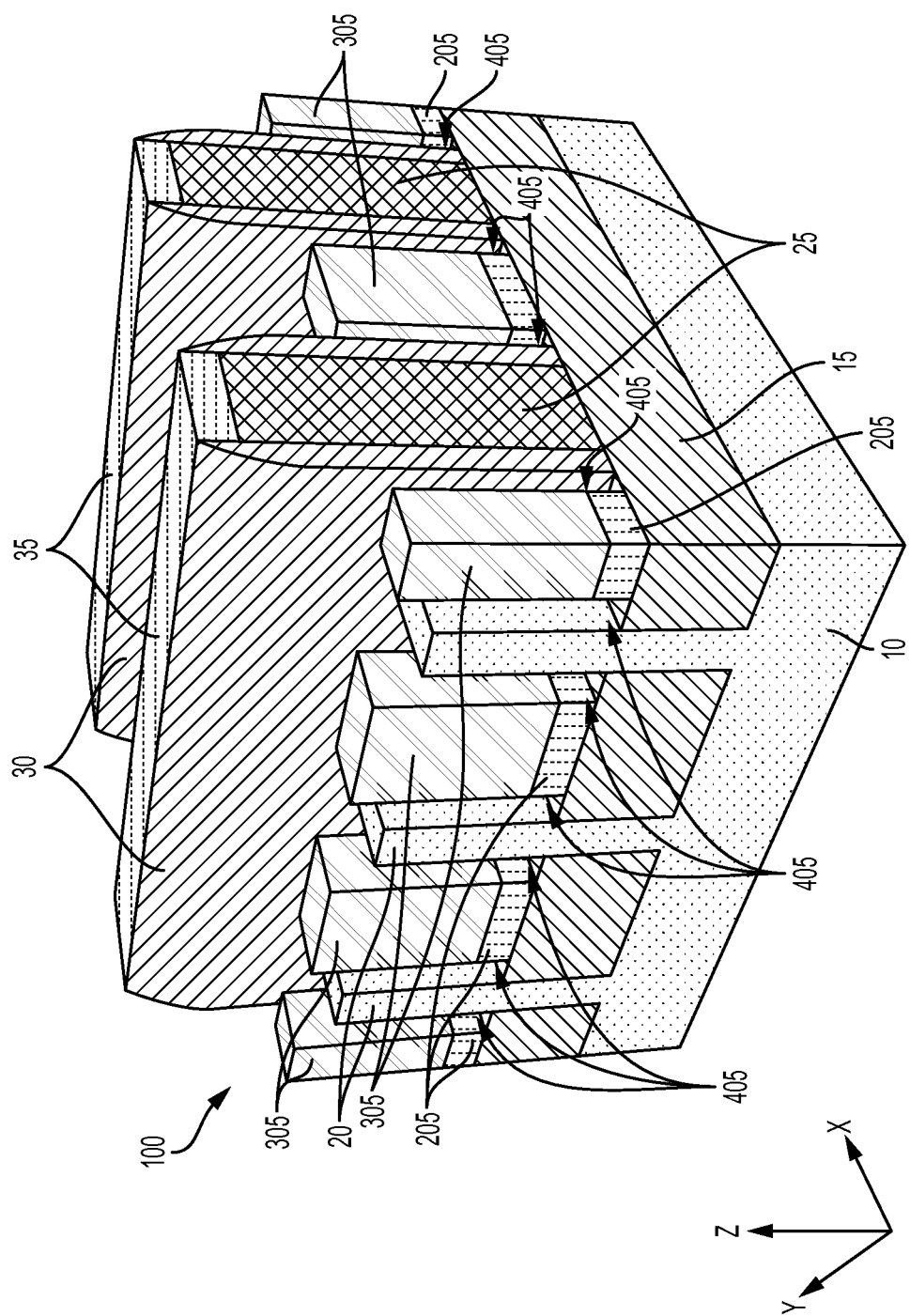
FIG. 4 is a perspective view of the intermediate finFET device illustrating removal of an exposed oxide layer according to an embodiment.

FIG. 4 illustrates removal of the exposed oxide layer 205 on the intermediate finFET device 100 according to an embodiment. The oxide layer 205 may be etched using a wet etchant, such that portions of the oxide layer 205 remain immediately under the filing material 305. In one implementation, buffered hydrofluoric acid (BHF) may be utilized as the wet etchant to remove the oxide layer 205, which is also known as buffered oxide etch (BOE).

Etching the oxide layer 205 leaves trenches 405 (e.g., second trenches) on the sides of the fins 20. Also, etching the oxide layer 205 leaves free-standing pillars of filling material 305 (e.g., SiN) on top of a pillar of oxide layer 205. The pillars of filling material 305 are designed to be taller (in the z-axis) than the nearby fins 20. In one implementation, the free-standing pillars of the filling material 305 may be 4-10 nm taller than the fins 20. The taller height of the filling material 305 along with the trenches 405 are utilized to form pencil-shaped epitaxial layers as depicted in FIGS. 5A and 5B.

Figure 5A:
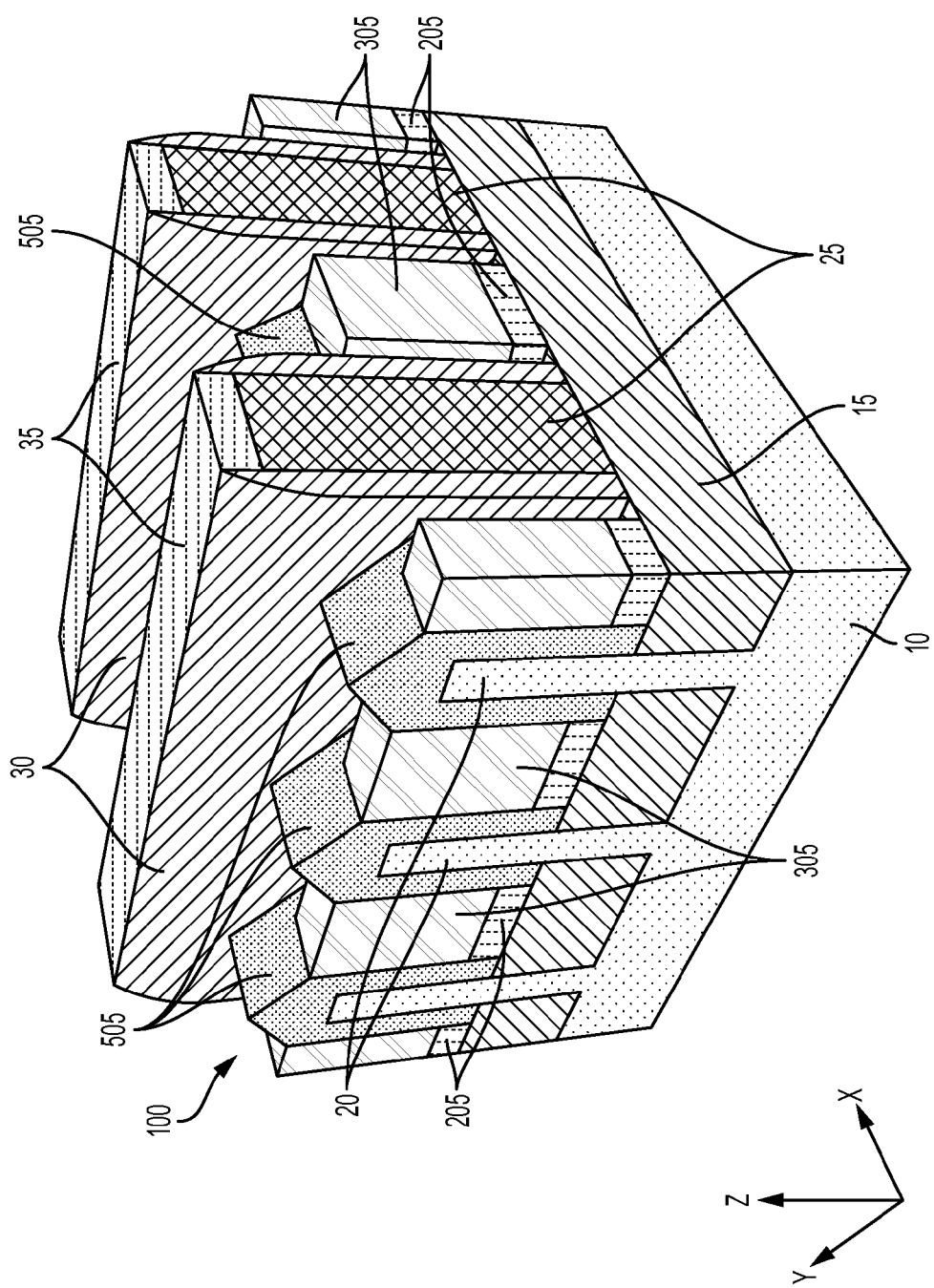
FIG. 5A is a perspective view of the intermediate finFET device illustrating epitaxial growth according to an embodiment.
Figure 5B:
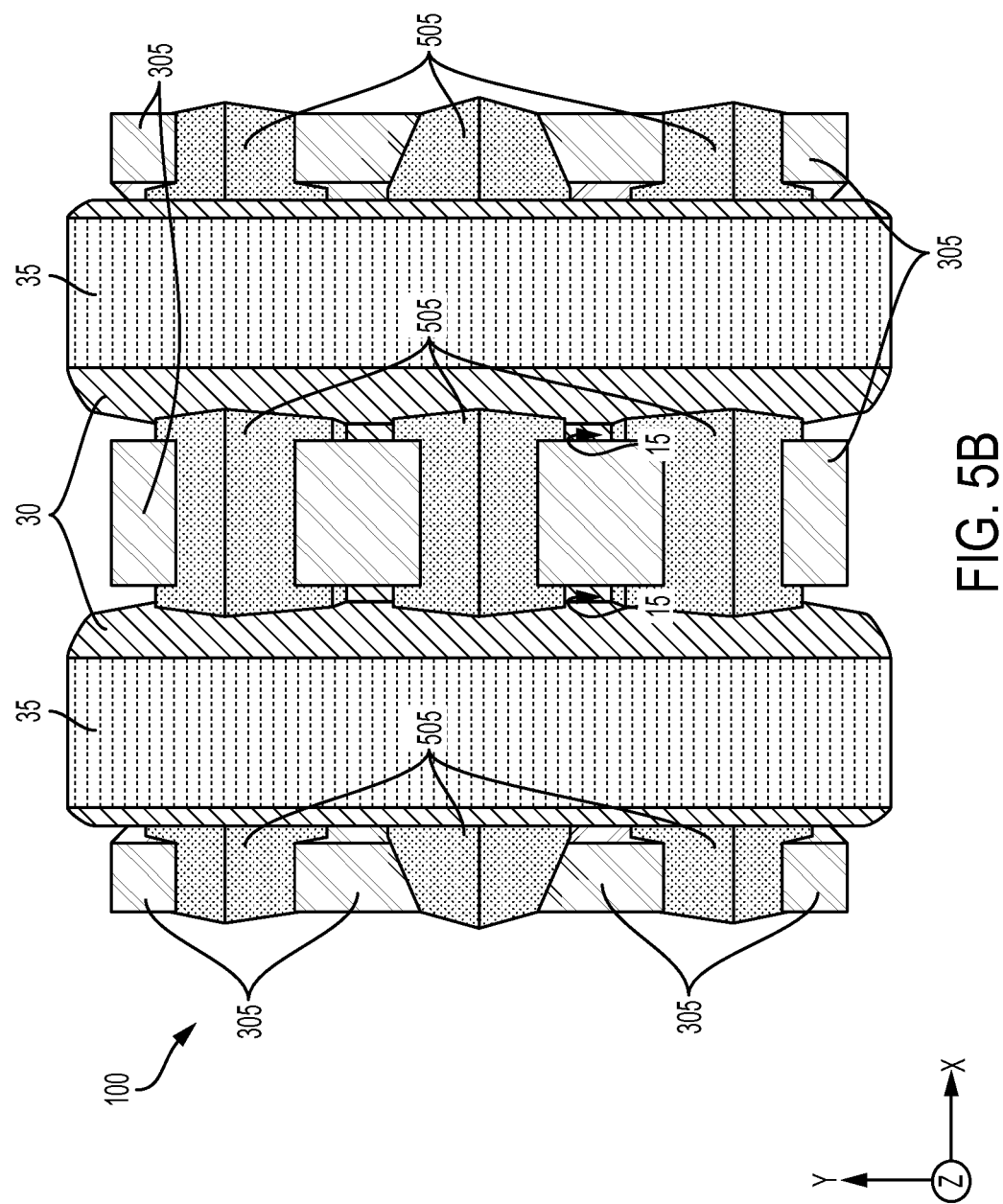
FIG. 5B is a top view of the intermediate finFET device illustrating epitaxial growth according to an embodiment.

FIG. 5A is a perspective view of the intermediate finFET device 100 and FIG. 5B is a top view of the intermediate finFET device 100, both of which illustrate epitaxial growth according to an embodiment. In FIGS. 5A and 5B, an epitaxial layer 505 grows from the top and side of the fins 20 in the space provided by the trenches 405 (shown in FIG. 4). The top of the epitaxial layer 505 forms a triangle shape because of the confinement in the trench 405 and the taller pillars of the filling material 305 that further confine the epitaxial layer 505 above the fin 20, until the triangle shape is formed. Also, the triangle shape is formed because of the crystal growth direction (e.g., the lattice structure) established/oriented in the fins 20. Epitaxy refers to the deposition of a crystalline over layer on a crystalline substrate (i.e., the fins 20), and the over layer is called an epitaxial film or epitaxial layer. Because the substrate acts as a seed crystal, the deposited epitaxial film locks into the crystallographic orientation of the substrate crystal. FIG. 5B illustrates that the epitaxial layer 505 is also bounded by the low-k spacer layer 30. After extending to the low-k spacer layer 30, the epitaxial layer 505 extends in the y-axis in the space between the pillar and the low-k spacer layer 30.

When fabricating a p-type field effect transistor (PFET), the deposited epitaxial layer 505 may be silicon germanium (SiGe). When fabricating an n-type field effect transistor (NFET), the deposited epitaxial layer 505 may be silicon doped with, e.g., phosphorus (P). In the triangle shape formed at the top of the epitaxial layer 505, the top angle of the triangle may each range from about 60-80°.

Figure 6:
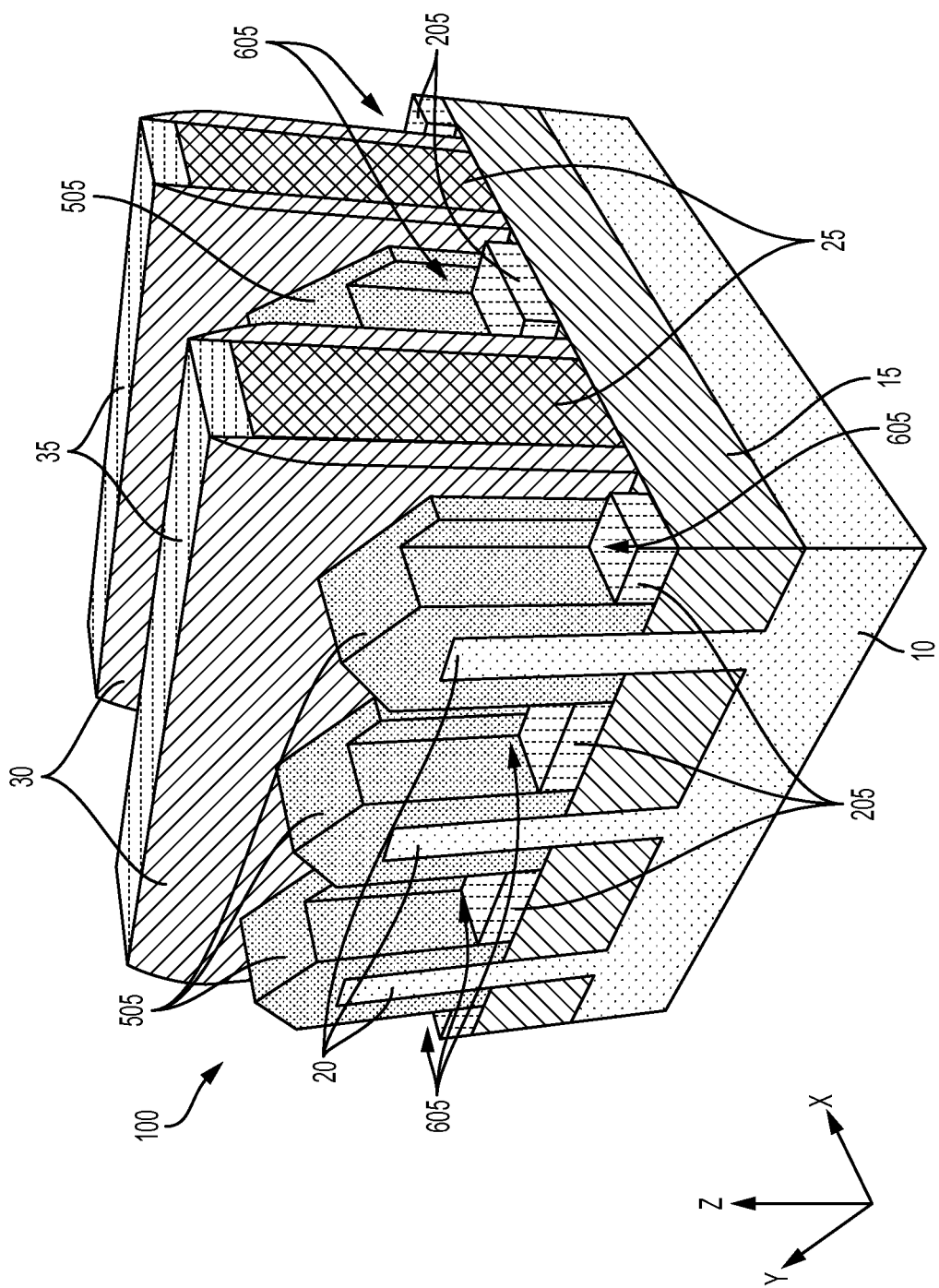
FIG. 6 is a perspective view of the intermediate finFET device illustrating removal of the filling material according to an embodiment.

FIG. 6 is a perspective view of the intermediate finFET device 100 illustrating removal of the filling material 305. Etching is performed to selectively remove the filling material 305 (e.g., SiN) and not the low-k spacer layer 30 (e.g., SiBCN or SiOCN). A wet or dry etchant may be utilized to remove the filling material 305 relative to the other layers not removed. Removal of the filling material 305 leaves spaces 605 (e.g., third trenches) above the oxide layer 205. The spaces 605 reveal that a flange portion of the epitaxial layer 505 abuts the low-k spacer layer 30.

Figure 7A:
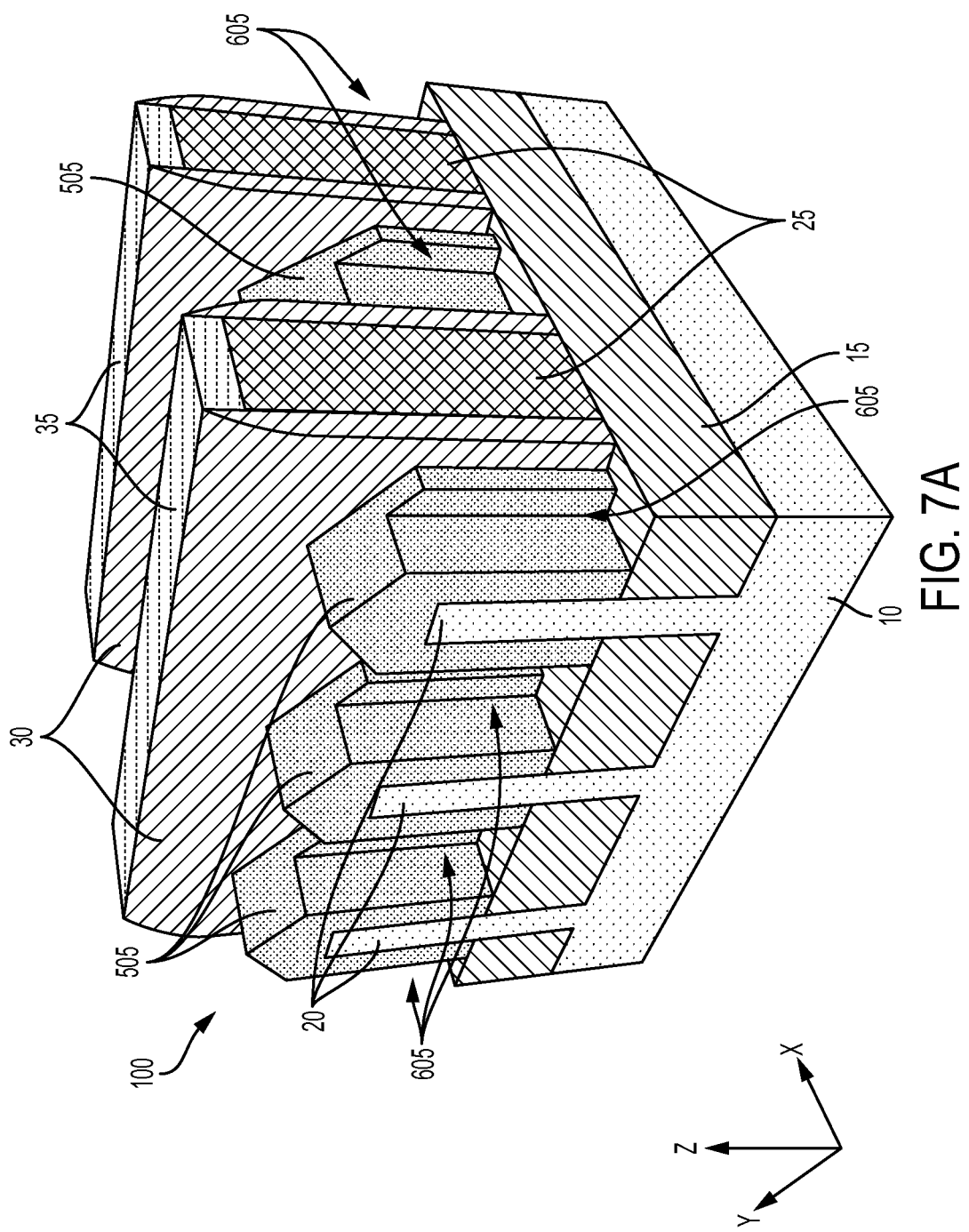
FIG. 7A is a perspective view of the intermediate finFET device illustrating that the oxide layer is removed according to an embodiment.
Figure 7B:
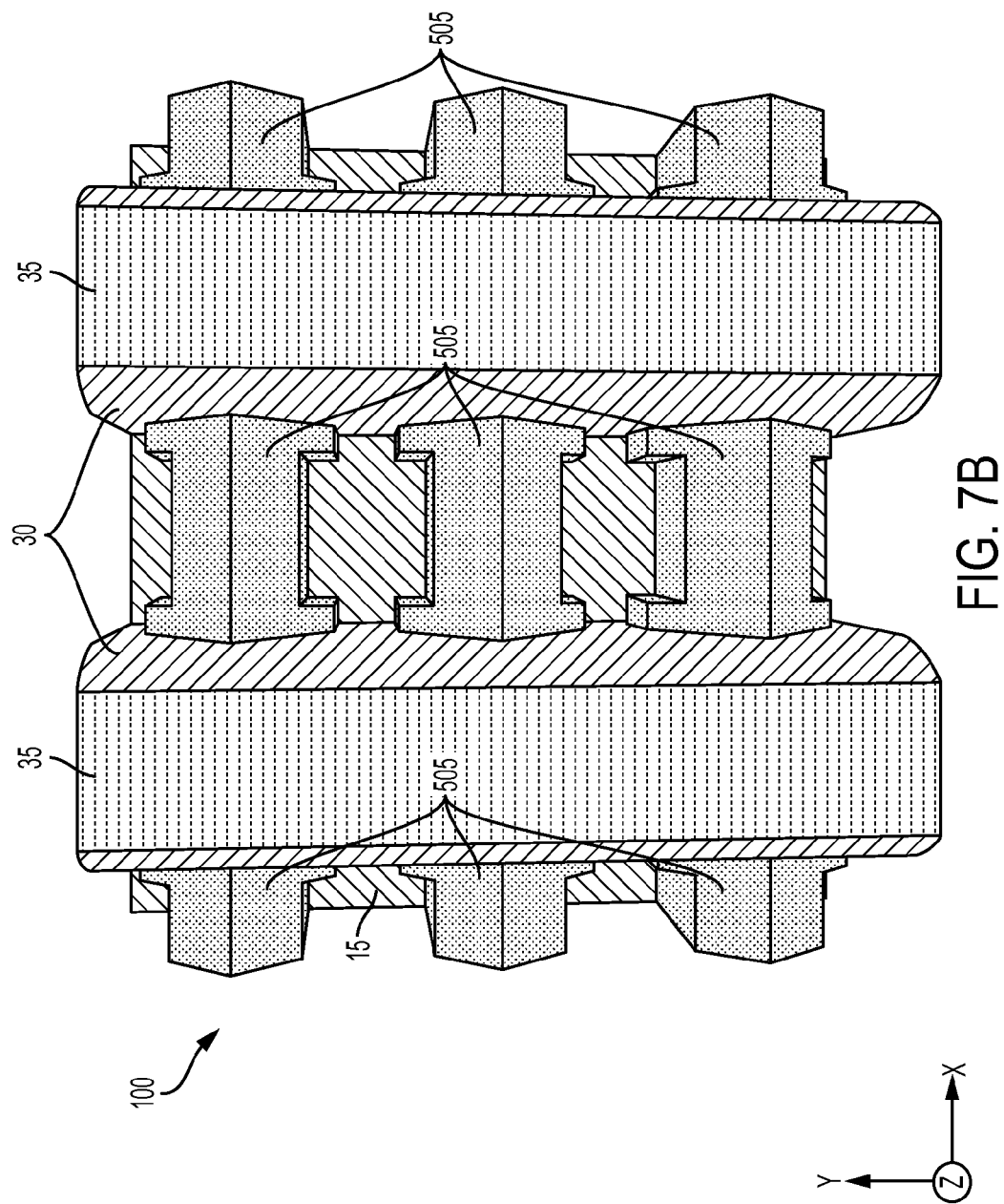
FIG. 7B is a top view of the intermediate finFET device illustrating that the oxide layer is removed according to an embodiment.

FIG. 7A is a perspective view of the intermediate finFET device 100 and FIG. 7B is a top view of the intermediate finFET device 100, both of which illustrate that the oxide layer 205 has been removed according to an embodiment. The remaining oxide layer 205 (e.g., $SiO_2$) is removed at the source/drain area, which allows the spaces 605 to extend down to the oxide layer 15 in the z-axis. Removal of the oxide layer 205 from the sides of the epitaxial layer 505 (near the bottom) exposes the oxide layer 15. An unmerged pencil-shaped epitaxial layer 505 is formed over the fins 20, i.e., on the source and drain. In one implementation, dilute hydrofluoric acid (DHF) may be utilized to remove the oxide layer 205. Removal of the oxide layer 205 in FIG. 6 to FIG. 7 can be done by either dry oxide etch or wet oxide etch (e.g. HDF). The etch time of the oxide layer 205 can be tuned such that the oxide layer 15 below the oxide layer 205 is not etched. There can be some small loss (<5 nm) of oxide layer 15 that is not covered by the oxide layer 205 during the etching. It is noted that the oxide layer 15 uncovered by the oxide layer 205 is very small (<4 nm by 4 nm), thus etching the uncovered oxide layer 15 is very slow. This small loss is much less than the total thickness of the oxide layer 15 (which is >30 nm) thus no problem is caused by the small loss.

Figure 8:
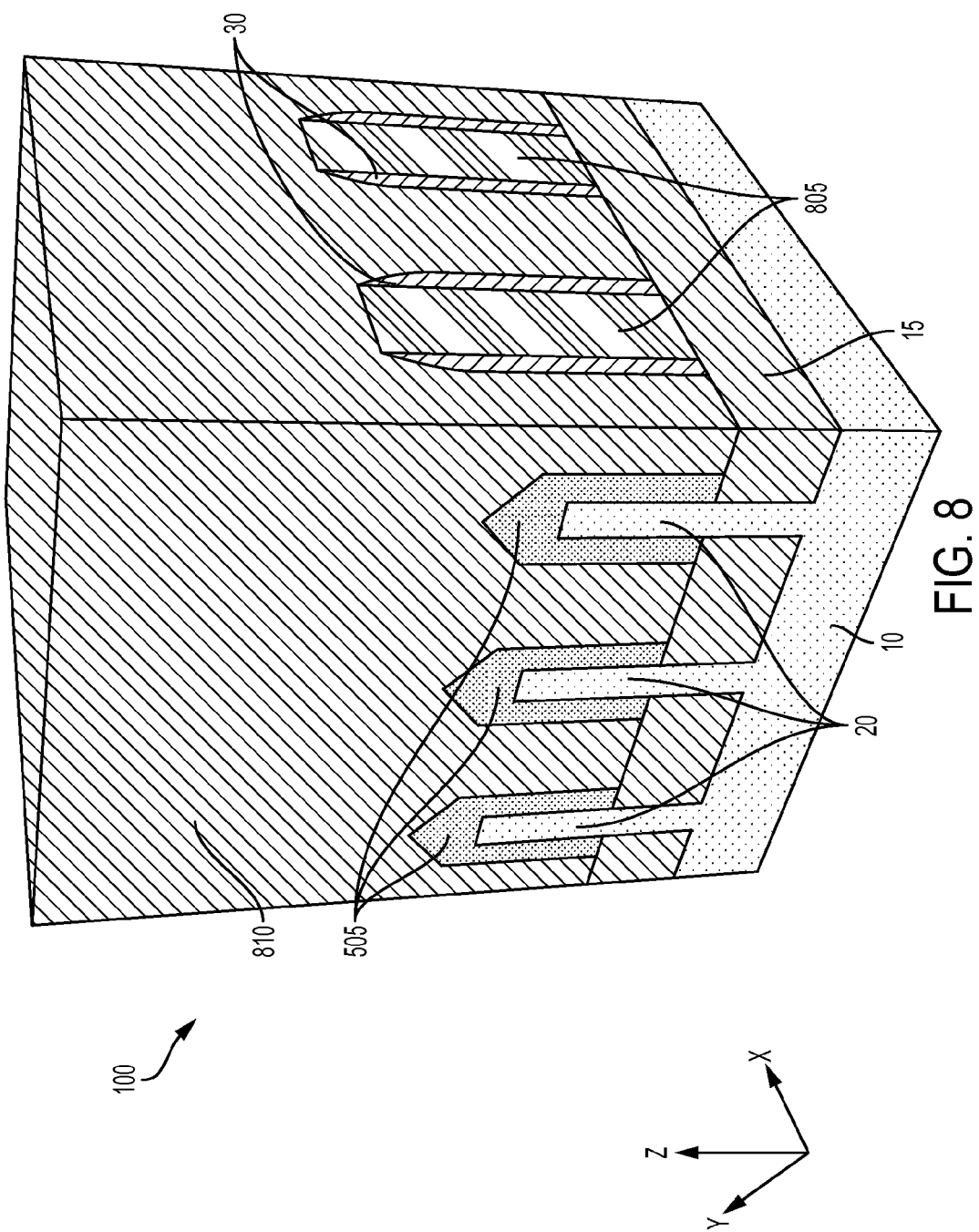
FIG. 8 is a perspective view of the intermediate finFET device illustrating further processing according to an embodiment.

FIG. 8 is a perspective view of the intermediate finFET device 100 illustrating further processing according to an embodiment. FIG. 8 shows that a standard replacement metal gate (RMG) process has occurred. Accordingly, the hard mask layer 35 is removed, and the dummy gate 25 is removed. The dummy gate 25 is replaced by a high-k gate 805 (e.g., a replacement gate). In one implementation, the high-k gate 805 may be a high-k dielectric material such as hafnium dioxide ($HfO_2$), zirconium dioxide ($ZrO_2$), titanium dioxide ($TiO_2$), etc. One skilled in the art understands the RMG (replacement metal gate) process.

An oxide layer 810 (e.g., filling material) is deposited over the entire top surface of the intermediate finFET device 100. The oxide layer 810 may be a flowable oxide (FOX). In one implementation, the oxide layer 810 may be silicon dioxide.

Figure 9A:
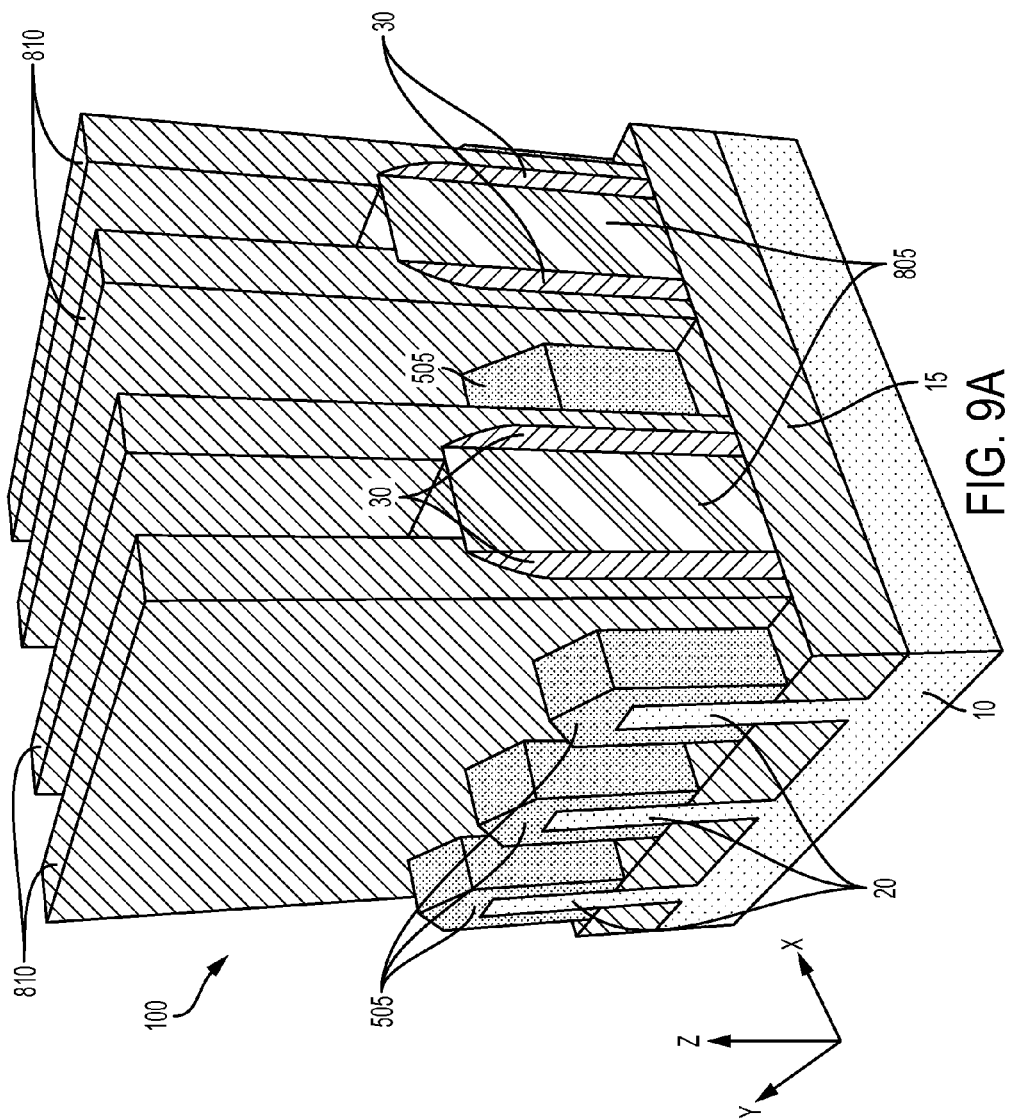
FIG. 9A is a perspective view of the intermediate finFET device illustrating contact openings in the oxide layer according to an embodiment.
Figure 9B:
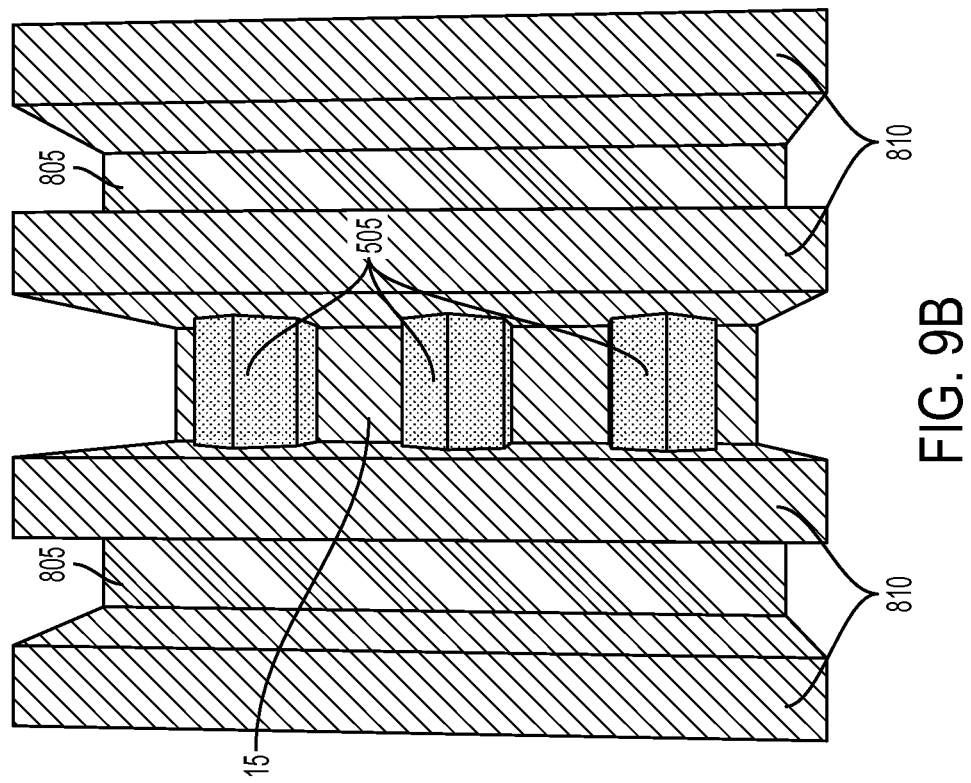
FIG. 9B is a top view of the intermediate finFET device illustrating contact openings in the oxide layer according to an embodiment.

FIG. 9A is a perspective view of the intermediate finFET device 100 and FIG. 9B is a top view of the intermediate finFET device 100, both of which illustrate contact openings in the oxide layer 810 according to an embodiment. Contact openings are formed over the source/drain contacts (area) and over the gate contacts. Etching of the oxide layer 810 opens the gate, source, and drain contacts. The contact openings are to allow a conductive layer, e.g., metal liner, to be deposited on the gate, source, and drain.

Figure 10A:
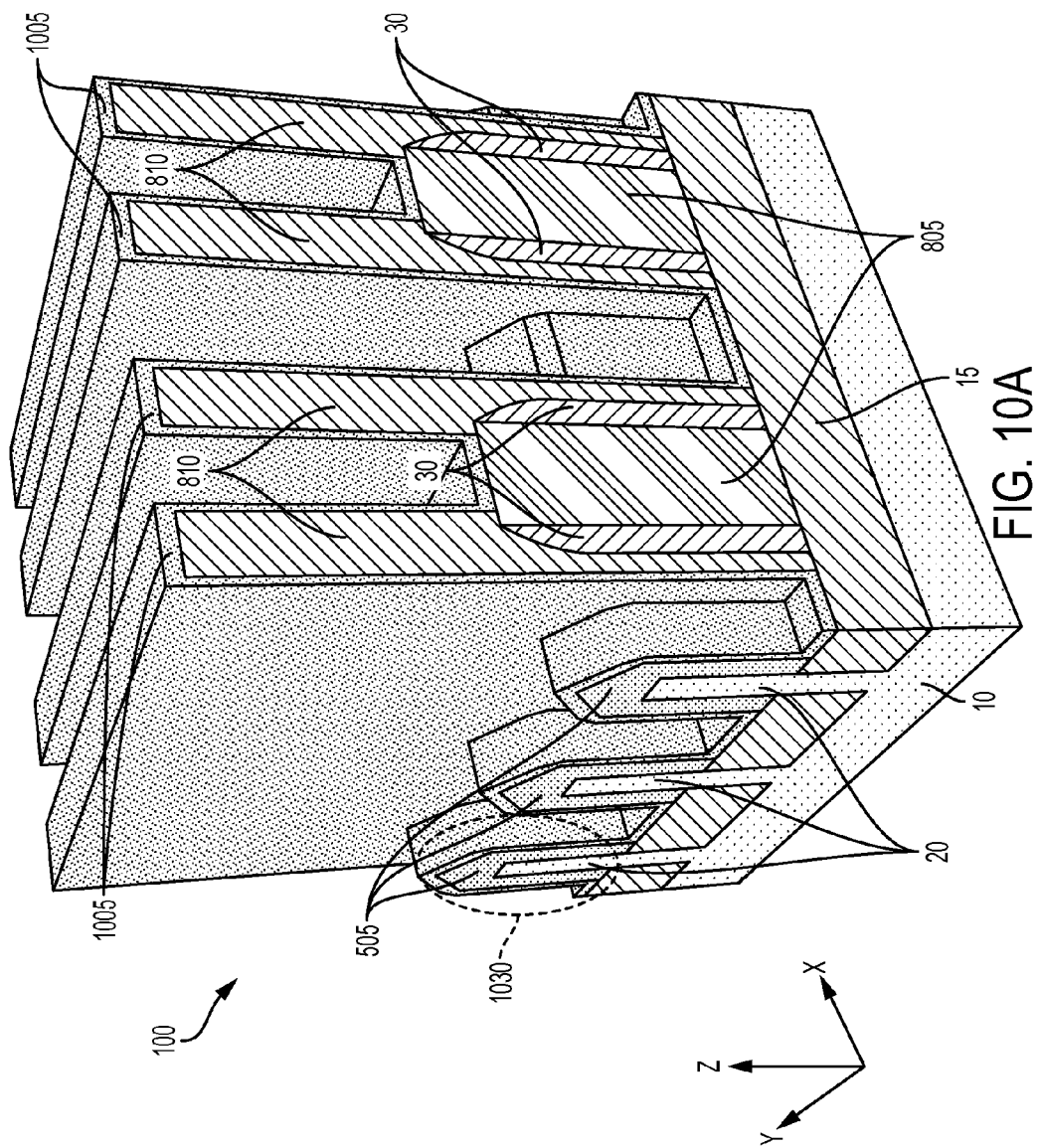
FIG. 10A is a perspective view of the intermediate finFET device illustrating deposition of a metal liner according to an embodiment.
Figure 10B:
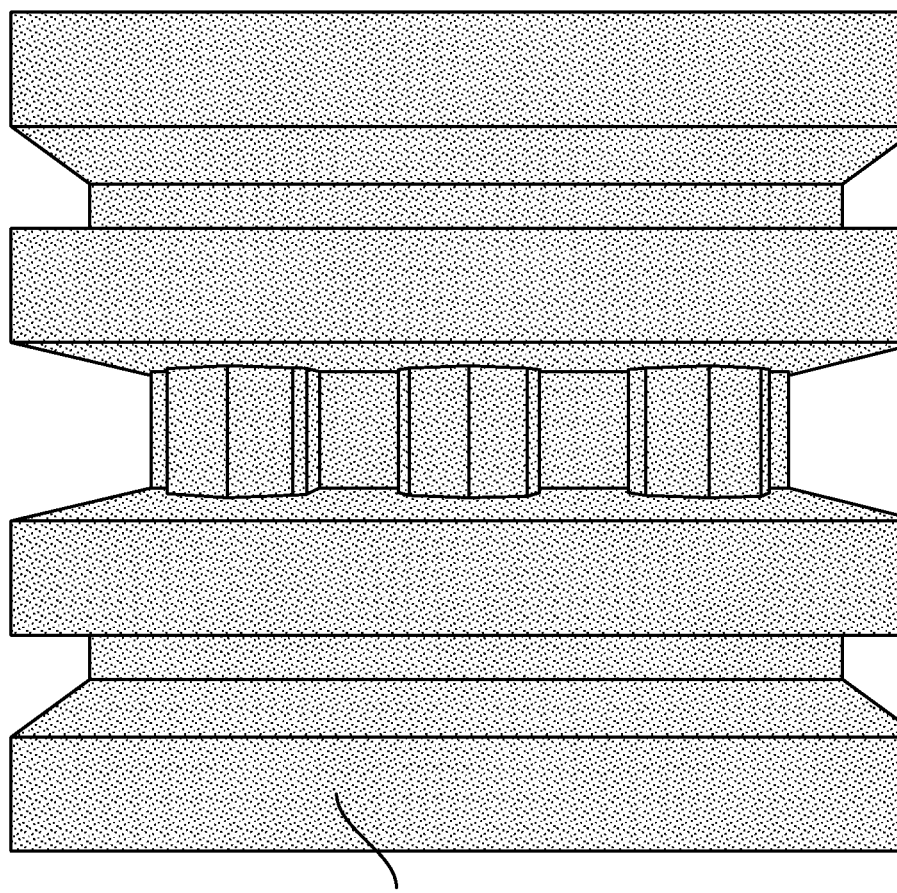
FIG. 10B is a top view of the intermediate finFET device illustrating deposition of a metal liner according to an embodiment.
Figure 10B:
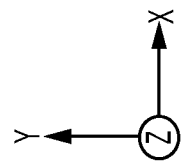

FIG. 10A is a perspective view of the intermediate finFET device 100 and FIG. 10B is a top view of the intermediate finFET device 100, both of which illustrate deposition of a metal liner 1005 according to an embodiment. The metal liner 1005 is a conductive layer. The metal liner 1005 is deposited over the entire top surface of the intermediate finFET device 100 as depicted in FIG. 10B.

The metal liner 1005 has at least two layers. For example, the metal liner 1005 comprises a first layer and a second layer deposited on top of the first layer. The first layer is directly on top of the oxide layer 15, the epitaxial layer 505, the high-k gate 805, and the oxide layer 810. The second layer is deposited on top of the first layer. The first layer of the metal liner 1005 may be titanium (Ti), and the second layer of the metal liner may be titanium nitride (TiN). Other material may be utilized for the first layer of the metal liner 1005, such as, e.g., NiPt, NiPtTi, and Co. Also, other material may be utilized for the second layer of the metal liner 1005, such as, e.g., fluorine-free tungsten. The thickness of the metal liner 1005 may range from 4.5-13 nm. The thickness of the first layer may range from 3-8 nm, and the thickness of the second layer may range from 1.5-5 nm.

Figure 10C:
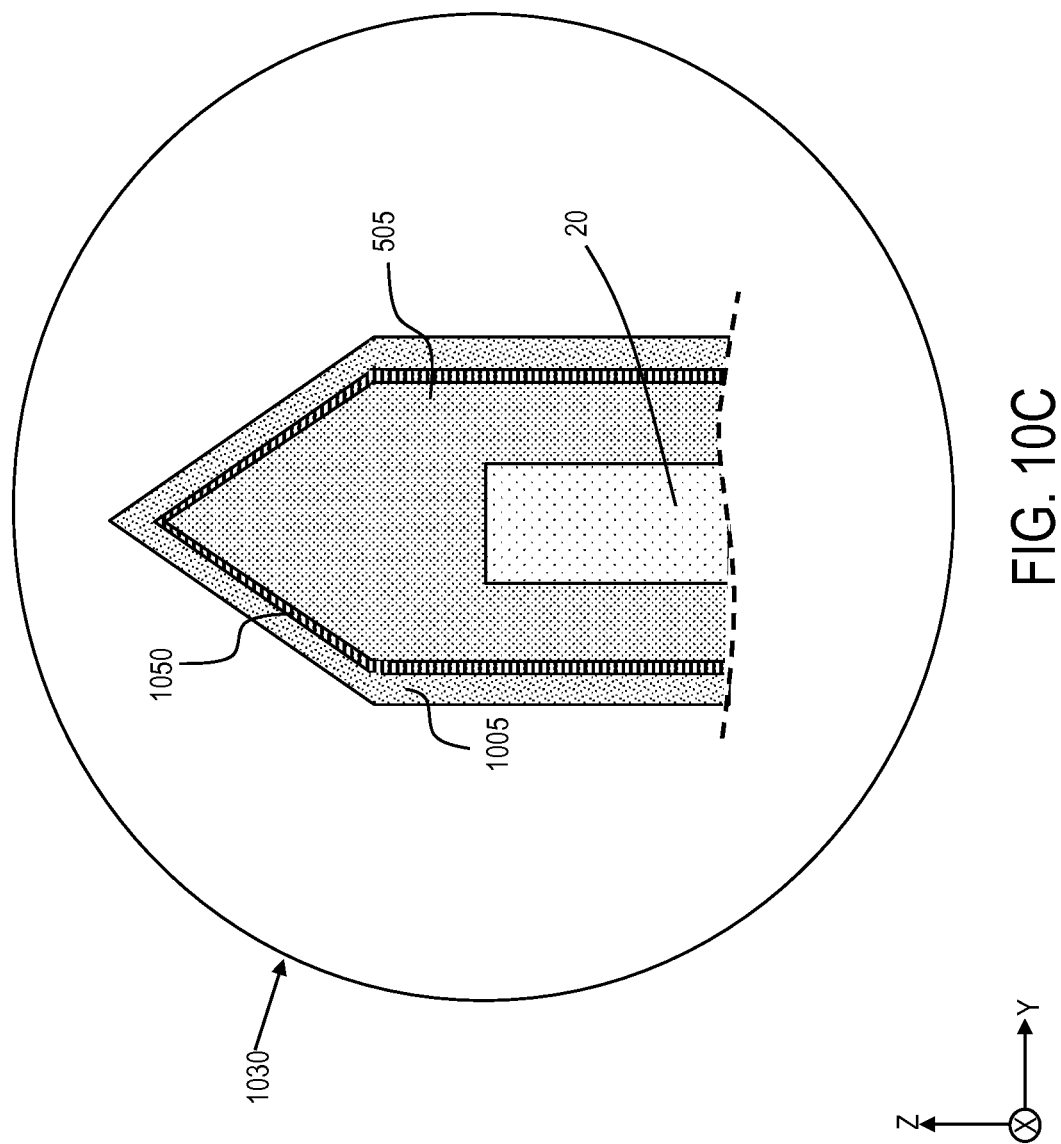
FIG. 10C is an abbreviated view enlarged to illustrate the wrap-around metal silicide according to an embodiment.

The interface between the metal liner 1005 (e.g., the first layer) and the epitaxial layer 505 forms silicide. Oval 1030 highlights an example of an interface at which silicide is formed, as shown in FIG. 10C. The metal liner 1005 wraps around the epitaxial layer 505, i.e., wraps around the top and side. Accordingly, the silicide formed at the interface (i.e., between the metal liner 1005 and epitaxial layer 505) wraps around the top and side of the epitaxial layer 505, thereby forming the wrap-around silicide on the epitaxial layer 505. Fins 20 are on two sides of the high-k gate 805. On one side of the high-k gate 805, the fin 20 is the source, and on the other side of the high-k gate 805, the fin 20 is the drain. The metal liner 1005 forming the silicide wraps around the source and drain of the fin 20 for maximum contact area. In one implementation, annealing may be performed on the intermediate finFET device 100 to help facilitate the formation of the wrap-around metal silicide.

FIG. 10C is an abbreviated view 1030 (of the intermediate finFET device 100 in FIG. 10A) that has been enlarged to illustrate the wrap-around metal silicide 1050 according to an embodiment. As can been seen, the metal silicide contact 1050 wraps around the pencil-shaped epitaxial layer 505 and is formed at the interface of the pencil-shaped epitaxial layer 505 and the metal liner 1005. Although FIG. 10C only shows a single fin 20 for explanation purposes, it is understood that the wrap-around metal silicide contact 105 wraps around each of the fins 20. The height of the epitaxial layer 505 measured from the isolation layer 15 to the top of the epitaxial layer triangle ranges from 35-65 nm in the z-axis.

Figure 11:
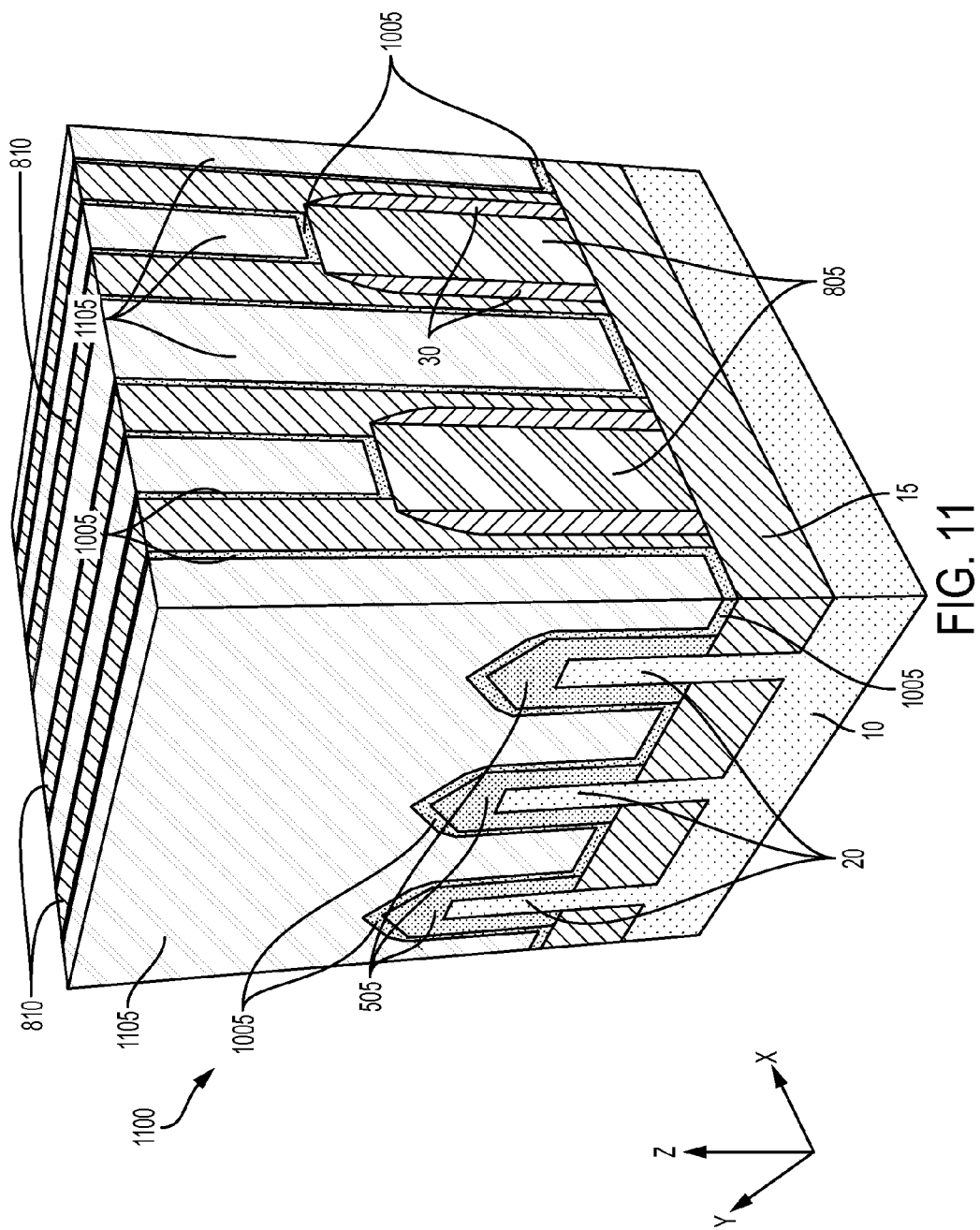
FIG. 11 is a perspective view of a completed finFET device according to an embodiment.

FIG. 11 is a perspective view of a completed finFET device 1100 according to an embodiment. In FIG. 11, a filling material 1105 such as tungsten (e.g., second filling material) is deposited over the entire top surface of the finFET device 1100. Chemical mechanical polishing/planarization (CMP) is performed to reduce the height of the filling material 1105. Also, the polishing/planarization removes the top part of the metal liner 1005, thereby separating metal liner 1005 connections to the source (fin 20), the high-k gate 805, and the drain (other side of the fin 20), such that the source, high-k gate, and drain can be independently controlled (via an applied voltage).

Figure 12B:
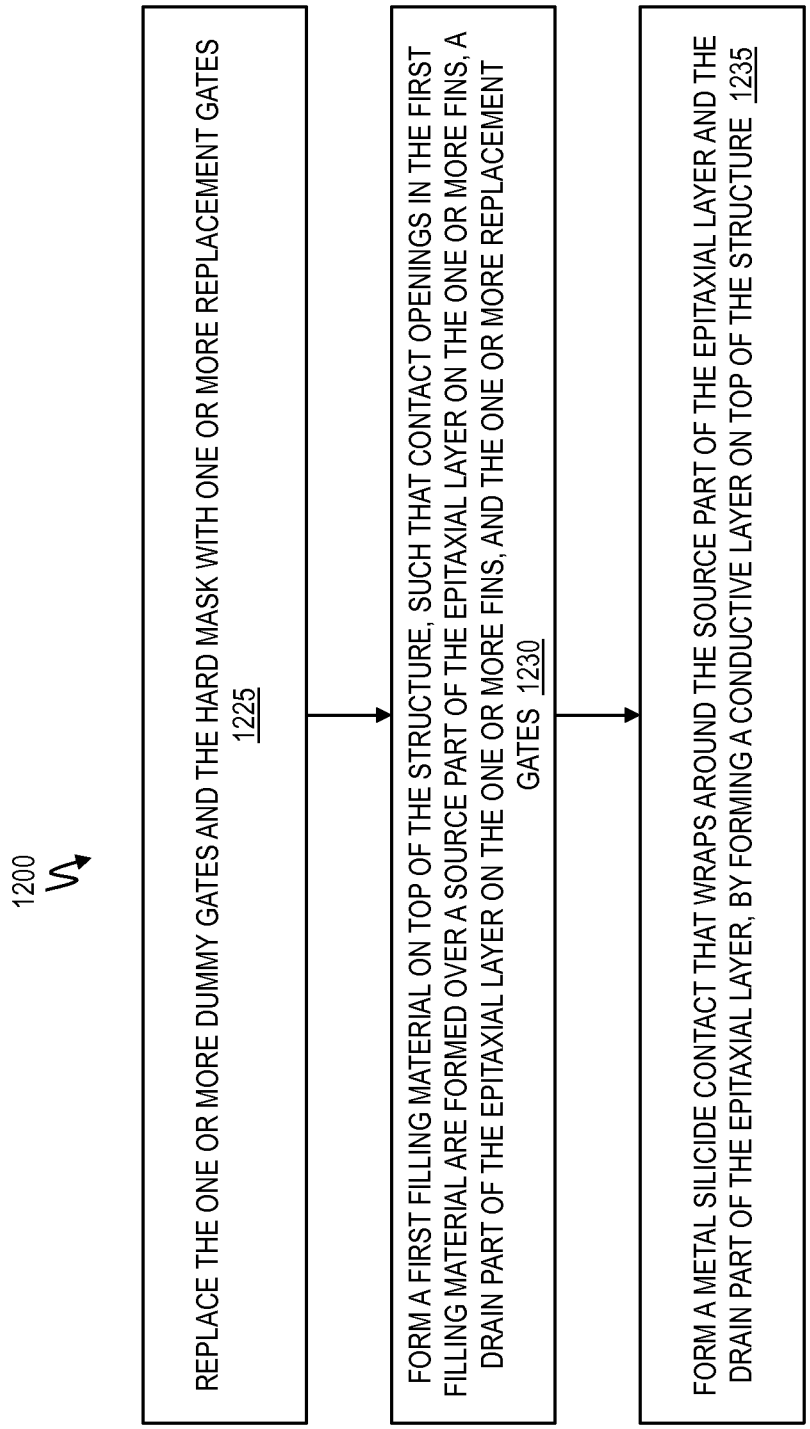

Now turning to FIGS. 12A and 12B, a flow chart of a method 1200 of fabricating the transistor 1100 with a wrap-around metal silicide is provided according to an embodiment.

At block 1205, a structure 100 (intermediate finFET device) is provided which includes one or more dummy gates 25 on a top of an isolation layer 15 and over one or more fins 20, a hard mask 35 on top of the one or more dummy gates 25, and spacers 30 on the sides of the one or more dummy gates 25 and the hard mask 35, as depicted in FIG. 1. The isolation layer 15 is on top of a substrate 10.

At block 1210, pillars (layers 205 and 305) are formed along the sides of the one or more fins 20 such that trenches 405 separate the pillars from the sides of the one or more fins 20, where the pillars include the first intermediate layer 205 formed on the isolation layer 15 and a second intermediate layer 305 formed on the first intermediate layer 205.

At block 1215, an epitaxial layer 505 is deposited in the trenches 405 such that the epitaxial layer 505 is laterally confined by the pillars, and a top of the epitaxial layer 505 forms a triangular shape that extends higher than the pillars.

At block 1220, the pillars are removed such that straight sidewalls of the epitaxial layer 505 are exposed, as depicted in FIGS. 7A and 7B.

At block 1225, the one or more dummy gates 25 and the hard mask 35 are replaced with one or more replacement gates 805.

At block 1230, a first filling material 810 is formed on top of the structure 100, such that contact openings in the filling material 810 are formed over a source part of the epitaxial layer 505 on the one or more fins 20, a drain part of the epitaxial layer 505 on the one or more fins 20, and the one or more replacement gates 805.

At block 1235, a metal silicide contact 1050 is formed that wraps around the source part of the epitaxial layer 505 and the drain part of the epitaxial layer 505, by forming a conductive layer 1005 on top of the structure 100.

The conductive layer is formed so as not to connect together the source part, the drain part, and the one or more replacement gates. One skilled in the art understands that one part of the epitaxial layer 505 on the fin 20 corresponds to the source part (S) on one side of the gate 805 and the other part of the epitaxial layer 505 on the (same) fin 20 corresponds to the drain part (D) on the other side of the gate 805. The conductive layer 1005 (i.e., the metal liner) wraps around the source part of the epitaxial layer and the drain part of the epitaxial layer.

A second filling material 1105 is deposited on top of the conductive layer 1005. The first filling material 810, the second filling material 1105, and the conductive layer 1005 are planarized (e.g., CMP) such that the conductive layer 1005 is not continuous, thereby separating the conductive layer from connecting the source part, the drain part, and the one or more replacement gates, as depicted in FIG. 11.

The conductive layer comprises a first layer and a second layer, and the first layer is deposited on top of the source part of the epitaxial layer, the drain part of the epitaxial layer, the one or more replacement gates, and the isolation layer, as depicted in FIGS. 10A and 10B. The first layer comprises titanium. The second layer comprises titanium nitride.

The metal silicide contact 1050 that wraps arounds the source part of the epitaxial layer 505 and the drain part of the epitaxial layer is assisted in formation by annealing. The straight sidewalls and the triangle top of the epitaxial layer form a pencil shape (e.g., the tip of a pencil), and the metal silicide contact 1050 wraps around the pencil shape of the epitaxial layer 505.

In one implementation, the one or more fins 20 have a fin pitch of less than 42 nanometers. The fin pitch is the distance between the center of one fin 20 and to the center of the nearest fin 20 measure in the in the y-axis.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A transistor comprising: a structure including one or more replacement gates on a top of an isolation layer and over one or more fins, and spacers on sides of the one or more replacement gates, wherein the isolation layer is on top of a substrate; an epitaxial layer formed around the one or more fins, a top of the epitaxial layer forming a triangular shape that extends higher than the one or more fins, wherein the epitaxial layer has straight sidewalls touching and extending directly from the triangular shape such that the base of the triangular shape matches a width of the epitaxial layer; a flange portion of the epitaxial layer abuts the spacers on the sides of the one or more replacement gates; and wherein the flange portion is a lateral extension from the triangular shape; a first filling material on top of portions of the epitaxial layer, the spacers, and the one or more replacement gates, wherein contact openings in the first filling material are over a source part of the epitaxial layer on the one or more fins, a drain part of the epitaxial layer on the one or more fins, and the one or more replacement gates; a conductive layer formed on top of the filling material, over the source part of the epitaxial layer on the one or more fins, over the drain part of the epitaxial layer on the one or more fins, and over the one or more replacement gates; and a metal silicide contact that wraps around the source part of the epitaxial layer and the drain part of the epitaxial layer.

2. The transistor of claim 1, wherein the conductive layer is formed so as not to connect together the source part, the drain part, and the one or more replacement gates.

3. The transistor of claim 1, wherein the conductive layer wraps around the source part of the epitaxial layer and the drain part of the epitaxial layer.

4. The transistor of claim 3, further comprising a second filling material on top of the conductive layer; and
wherein the first filling material, the second filling material, and the conductive layer have been planarized such that the conductive layer is not continuous, thereby separating the conductive layer from connecting the source part, the drain part, and the one or more replacement gates.

5. The transistor of claim 1, wherein the conductive layer comprises a first layer and a second layer, the first layer being deposited on top of the source part of the epitaxial layer, the drain part of the epitaxial layer, the one or more replacement gates, and the isolation layer.

6. The transistor of claim 5, wherein the first layer comprises titanium.

7. The transistor of claim 6, wherein the second layer comprises titanium nitride.

8. The transistor of claim 1, wherein the straight sidewalls and the triangular shape of the top of the epitaxial layer form a pencil shape; and
wherein the metal silicide contact wraps around the pencil shape of the epitaxial layer.

9. The transistor of claim 1, wherein the one or more fins have a fin pitch of less than 42 nanometers.

* * * * *